United States Patent [19]

Cazaux et al.

[11] Patent Number: 5,055,931
[45] Date of Patent: Oct. 8, 1991

[54] IMAGE SENSOR WITH HIGH STORAGE CAPACITY PER PIXEL

[75] Inventors: Yvon Cazaux; Gilles Boucharlat, both of Grenoble, France

[73] Assignee: Thomson Composants Militaires et Spatiaux, Courbevoie, France

[21] Appl. No.: 599,971

[22] Filed: Oct. 19, 1990

[30] Foreign Application Priority Data

Oct. 20, 1989 [FR] France .................................. 89 13748

[51] Int. Cl.$^5$ .............................................. H04N 3/14
[52] U.S. Cl. .................................. 358/213.11; 357/24
[58] Field of Search ...................... 358/213.11, 213.31, 358/213.29, 213.19; 357/24 LR, 30 G, 30 H

[56] References Cited

U.S. PATENT DOCUMENTS

| | | | |
|---|---|---|---|
| 4,592,029 | 5/1986 | Altman et al. | 358/213.11 |
| 4,771,183 | 9/1988 | McGlynn | 358/213.11 |
| 4,870,494 | 9/1989 | Tabei | 358/213.19 |
| 4,890,164 | 12/1989 | Taker et al. | 358/213.19 |
| 4,987,494 | 1/1991 | Freeman | 358/213.31 |

OTHER PUBLICATIONS

SPIE Optical Sensors and Electronic Photography, vol. 1071, 1989, J. Janesick, et al., "Charge-Coupled Device Pinning Technologies", pp. 153–169.
Patent Abstracts of Japan, vol. 6, No. 9 (E-90) (887), Jan. 20, 1982, & JP-A-56 131976, Oct. 15, 1981, K. Sekine, "Manufacture of Solid Image Photographing Device".
Patent Abstracts of Japan, vol. 6, No. 16 (E-92) (894), Jan. 29, 1982, & JP-A-56 136086, Oct. 23, 1981, Y. Miyamoto, "Two-Dimensional Image Pickup Device".

Primary Examiner—Stephen Brinich
Attorney, Agent, or Firm—Oblon, Spivak, McClelland, Maier & Neustadt

[57] ABSTRACT

Disclosed is a charge-transfer or charge-coupled (CCD) type device, aimed at increasing the charge storage capacity. The disclosed photosensitive device includes a plurality of photosensitive cells. Each photosensitive cell includes an elementary photosensitive zone beneath which there is formed a potential well. According to one characteristic, the potential well has a surface area greater than the surface area of the elementary photosensitive zone. The disclosure can be applied to charge-couped devices that include a non-photosensitive zone between the pixels.

5 Claims, 3 Drawing Sheets

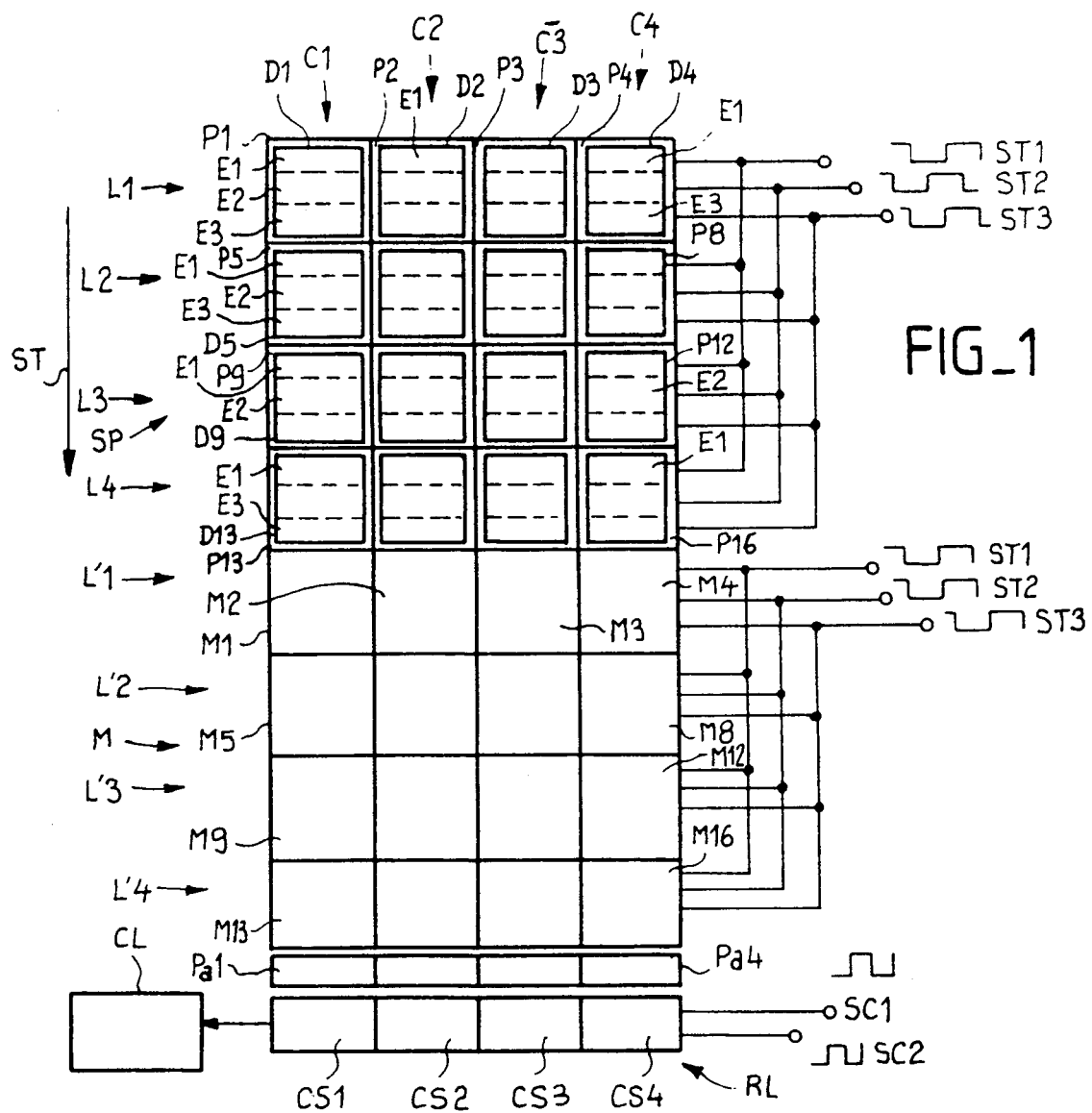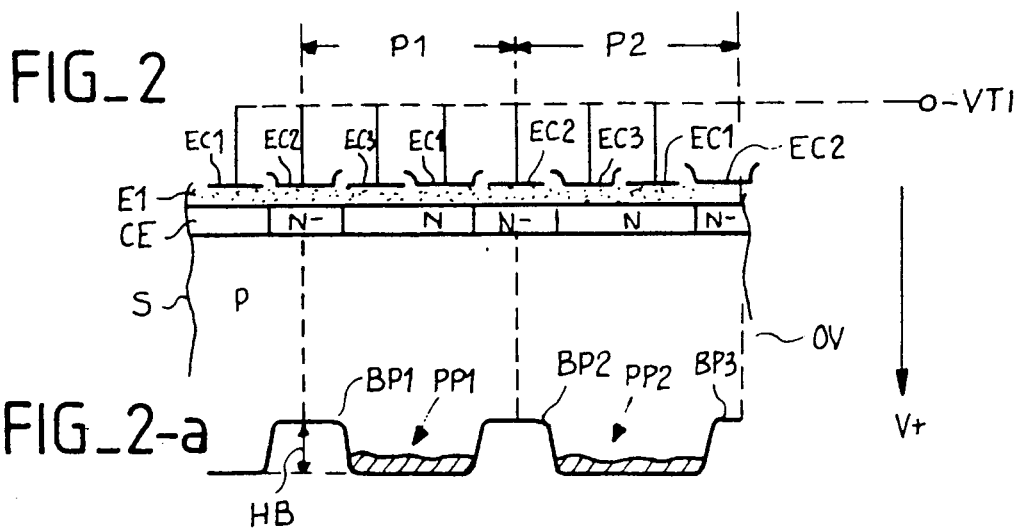

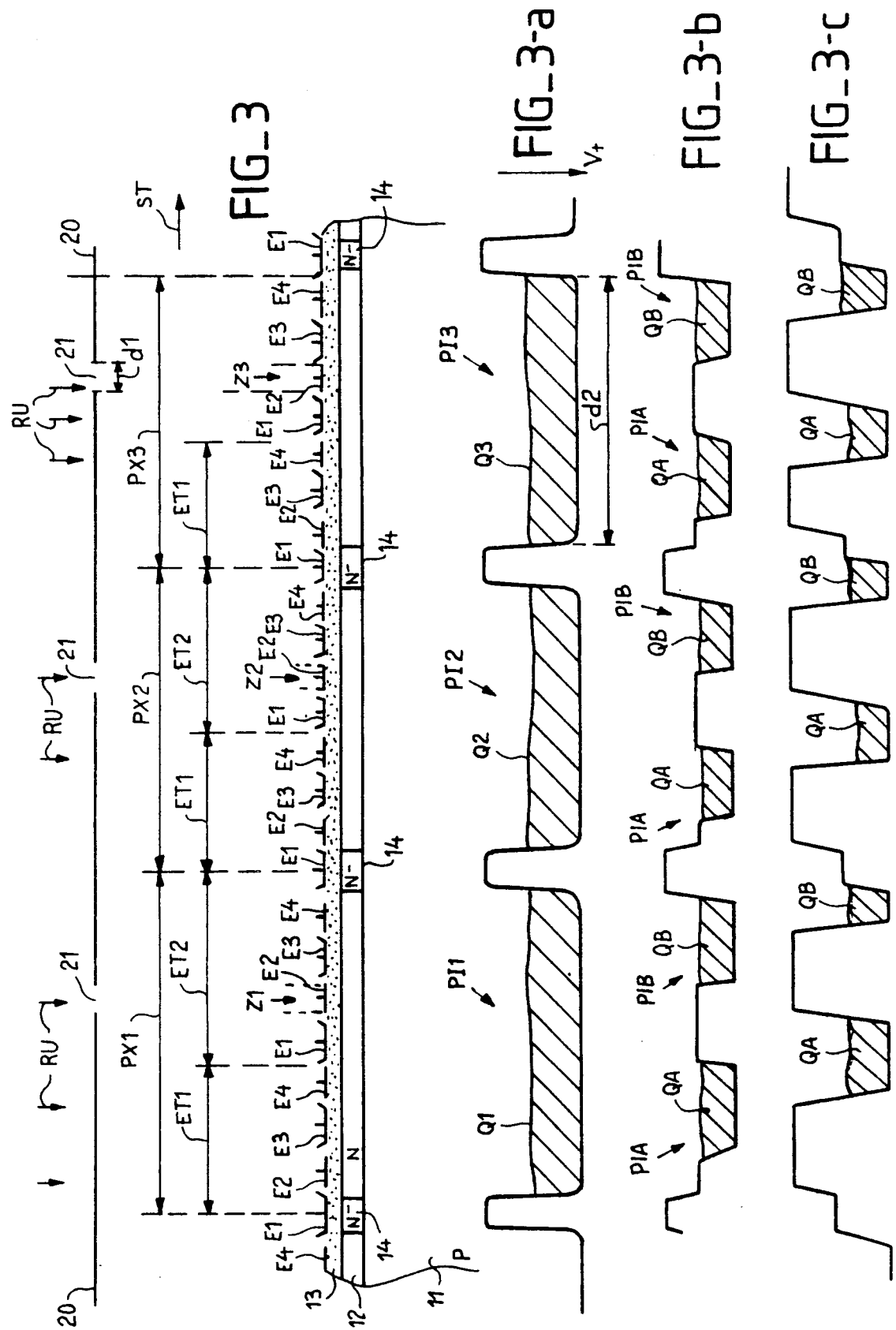

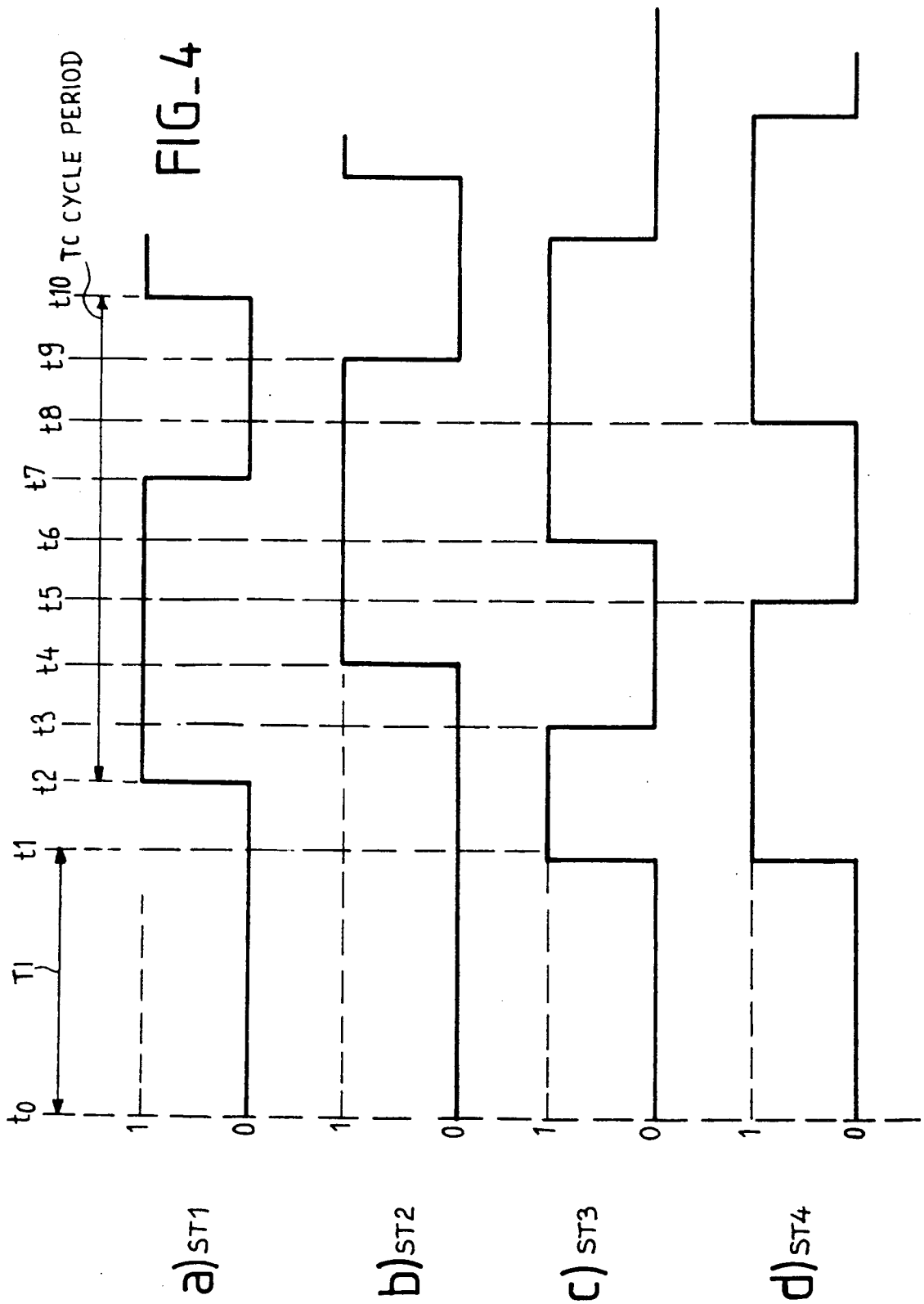

IMAGE SENSOR WITH HIGH STORAGE CAPACITY PER PIXEL

BACKGROUND OF THE INVENTION

1. Field of the Invention

The present invention concerns photosensitive charge-transfer devices or charge-coupled devices (CCDs) that are designed to constitute image sensors and comprise at least one row of photosensor cells. In particular, the invention concerns a novel structure of photosensor cells that enables major improvement in the storage capacity of these photosensor cells.

2. Description of the Prior Art

FIG. 1 gives a schematic view of a standard architecture of a charge-coupled device organized to form a surface image sensor. The image sensor has a photosensitive surface SP, divided into a plurality of elementary image cells or pixels (picture elements) P1 to P16 each comprising an elementary sensor, or elementary photosensitive zone D1 to Dn. The elementary sensors are arranged in rows and columns: in the non-restrictive example of FIG. 1 and to simplify this figure, only four rows L1 to L4 and four columns C1 to C4 of elementary sensors have been shown. However, it is clear that the image sensor may include a greater number of rows and columns, or even a smaller number of them.

According to a standard arrangement, the photosensitive surface SP is extended in the columnwise direction C1 to C4 by a CCD memory M forming four additional rows L'1 to L'4. The memory M is itself followed, conventionally, by a CCD reading register RL. The memory M is connected conventionally to the reading register by means of analog gates Pa1 to Pa4. The memory M is formed in a same way as the sensitive surface SP, i.e. it is also photosensitive, and to prevent it from producing charges under the effect of an illumination to which the photosensitive surface SP may be exposed, the entire zone corresponding to the memory M (but also the zone corresponding to the analog gates and to the reading register) is sheltered conventionally by an screen (not shown, and made of aluminium for example), that is opaque to the useful radiation to which the photosensitive surface SP is exposed.

The working of a device such as this is well known:

Since the photosensitive surface SP is exposed to a useful radiation (light notably) for a period of time called an integration period TI, charges are generated and stored at each pixel. At the end of the integration period TI, for each pixel, the charges stored at this cell are transferred into a memory compartment M1 to M16, each memory compartment corresponding to a given pixel P1 to P16.

This transfer is achieved in the columnwise direction C1 to C4: taking the example of the first column C1 for instance, the charges contained in the thirteenth pixel P13 are transferred to the thirteenth memory compartment M13 in passing successively through the first, fifth and ninth memory compartments while, similarly, the charges initially contained in the first, fifth and ninth pixels P1, P5, P9 are respectively transferred to the first, fifth and ninth memory compartments M1, M5 and M9. At the same time, similar operations are performed at the columns C2, C3, C4. This is obtained in a standard way by applying transfer signals ST1, ST2, ST3 to the elementary cells P1 to P16 as well as to the memory zones M1 to M16. These transfer signals have different phases so as to generate potential barriers and potential wells which enable the charges to be transferred along the columns C1 to C4, i.e. along a transfer direction ST which should lead these charges from the photosensitive surface SP up to a compartment CS1 to CS4 of the reading register RL. The transfer mode may be a mode with two phases, three phases, four phases or more: in the example shown in FIG. 1, this transfer is performed in three-phase mode, i.e. each sensor cell P1 to P16 has three electrodes E1, E2, E3 which follow one another in the columnwise direction C1 to C4 and to which the transfer signals ST1, ST2, ST3, having different phases, are applied.

When the charges have been transferred up to a memory zone M1 to M16, a new integration period TI starts, and new charges may be generated and stored at each of the elementary cells P1 to P16. During this new integration period TI, all the charges stored in the memory zones M1 to M16 are transferred row by row into the memory compartments CS1 to CS4 of the reading register RL: to this effect, the transfer signals ST1, ST2, ST3 are applied solely to the memory zones M1 to M16, in synchronism with shift control signals SC1, SC2 which are applied to the reading register RL: under the effect of the transfer signals, the charges stored in the thirteenth, fourteenth, fifteenth and sixteenth memory zones (memory zones that form a row L'4 closest to the reading register RL) are transferred respectively into the compartments CS1, CS2, CS3, CS4 of the reading register, while the charges contained in the other memory zones are transferred into memory zones of the next row closest to the reading register RL. The shift control signals SC1, SC2 are then applied to the reading register which transfers the charges contained in the compartments CS1 to CS4 to a reading circuit CL. Since the reading register is empty, the previous operations are renewed, i.e. the charges contained in the memory zones of the row closest to the reading register are transferred into this register. All the charges that have collected during the previous integration period TI have to be discharged from the memory zones M1 to M16 when the last integration period TI is completed.

The structure and the operation summarized above are well known and widely used. However, it is sought to improve the characteristics generally and, in certain applications, it is sought notably to increase the storage capacity of the charges at each pixel, as well as to achieve the maximum reduction of the dark current per pixel of these CCD image sensors.

A known method of reducing the dark current of the CCD image sensors is to cool them. But it is complicated to implement this method.

Another method that enables a sharp reduction in the dark current of the CCD image sensors consists in making them work in the mode of operation called the multi-pinned phase (MPP) mode.

Operation in MPP mode is applicable particularly to the case of the buried channel type CCD devices. In this mode of operation, the bias of the buried channel at the substrate/insulator layer interface, i.e. generally the silicon/silicon oxide interface, is reversed During the reversal at the Si/SiO$_2$ interface, holes collect and neutralize the thermal generation of charges in this region. Since the dark current is essentially a current produced in the region of the interface, it is very substantially reduced in this type of operation. An explanation of the operation in MPP mode is found in the article by James Janesick, Tom Elliot, George Fraschetti, Stewart Collins: "Charge-Coupled Device Pinning Technologies", in the SPIE journal, vol. 1071, *Optical Sensors and Electronic Photograghy*, (1989)/153.

FIG. 2 exemplifies a structure with three phases, namely with three transfer signals having different phases, and illustrates the potentials to be applied for operation in MPP mode. FIG. 2a has to be read with FIG. 2: it illustrates profiles of potentials forming potential wells designed to store charges generated during the integration period TI. According to the usual practice as regards charge-coupled devices, the positive potentials increase in the downward direction.

FIG. 2 shows two pixels P'1, P'2 seen in a sectional view. In relation to FIG. 1, this view may correspond for example to a sectional view in the columnwise direction C1 to C4. This sectional view shows two consecutive pixels such as the pixels P'1, P'2. In the example, the pixels P'1, P'2 are formed on a semiconductor substrate S made of silicon for example, with P type doping. The substrate S is covered with an electrically insulating layer EI made of $SiO_2$. Since the MPP structure described is of the three-phase type, the electrically insulating layer EI bears three electrodes EC1, EC2, EC3 per pixel. These three electrodes are designed to receive transfer signals (not shown) having different phases. Beneath the insulator layer EI, a layer with N type doping is designed, in a conventional way, to form a buried channel CE furthering the transfer of the charges.

In MPP mode, during the integration period TI mentioned above, all the electrodes of a pixel are taken to a negative potential $-VTI$ (generally of the order of $-10$ volts) with respect to the substrate. Since the electrodes EC1 to EC3 are all at one and the same negative potential, during the integration period TI, differences in doping have been introduced into the buried channel CE in such a way that, in the substrate S, two neighboring pixels are separated by a potential barrier BP1, BP2, BP3, a charge storage potential well PP1, PP2 being thus formed for each pixel. The height HB represents the difference between the potential wells and the potential barriers and symbolizes the quantity of charges that may be stored per potential well, i.e. per pixel.

As already mentioned further above, the MPP operation mode is particularly valuable in that it enables a considerable reduction in the dark current Io produced by each pixel Thus for example, in the case of a standard operation, called a "multiphase operation", the dark current Io is in the range of $700.10^{-12}$ amperes/cm$^2$ at ambient temperature while, in the MPP mode of operation, the dark current goes to $25.10-12$ amperes/cm$^2$ at one and the same ambient temperature.

However, the drawback of the MPP mode lies in the fact that it considerably reduces the charge storage capacity of the pixel and, consequently, reduces the dynamic range of use of the image sensor towards the high levels of illumination.

The invention is aimed at providing a solution to the problem of the dynamic range of use of the CCD image sensor towards the high levels of illumination. It can be applied particularly (but not exclusively) to the CCD image sensors working in the above-described MPP mode.

It must be noted that the invention can be applied in the case of CCD sensors including a non-photosensitive space between the rows of pixels or even between the columns of these pixels (in the context, for example, of the spectrum radiometer type of application).

SUMMARY OF THE INVENTION

According to the invention, there is proposed a charge-coupled photosensitive device including a plurality of photosensitive cells or pixels, each pixel including an elementary photosensitive zone beneath which there is formed a potential well designed for the storage of charges generated by the exposure of the elementary photosensitive zone to a useful radiation, wherein the area of the surface of the storage potential well is greater than the area of the surface of the elementary photosensitive zone, the two surfaces being considered in substantially parallel planes.

BRIEF DESCRIPTION OF THE DRAWINGS

The characteristics and advantages of the invention will appear more clearly from the following description, given as a non-restrictive example, with reference to the appended drawings wherein:

FIG. 1, already described, shows the general organization of a known type of CCD image sensor;

FIGS. 2 and 2a, already described, illustrate the structure and working of photosensitive sensors working according to the MPP mode;

FIG. 3 is a sectional drawing that gives a schematic view of the structure of an image sensor device according to the invention;

FIGS. 3a, 3b, 3c show profiles of ..potentials in relation with the structure of FIG. 3;

FIG. 4a–d illustrates the signals to be applied to the structure shown in FIG. 3.

DETAILED DESCRIPTION OF THE INVENTION

FIG. 3 is a schematic sectional view of several consecutive elementary image cells or pixels (picture elements) of a charge-coupled type of image sensor according to the invention. These pixels PX1, PX2, PX3 are arranged in the columnwise direction, for example in the direction of the columns C1 to C4 shown in FIG. 1, i.e. in the direction ST of the transfer of the charges towards a reading register (not shown).

To simplify FIG. 3 and the description, the image sensor or photosensitive device 10 of the invention is represented only by the three pixels PX1 to PX3. The photosensitive device has a substrate 11, made of silicon for example, with P type doping. In the vicinity of its surface, the substrate 11 has a layer 12 with N type doping, designed to form a buried channel Above the buried channel 12, an electrically insulating layer 13, made of $SiO_2$ for example, bears a succession of electrodes forming a succession of transfer stages ET1, ET2. In the non-restrictive example of the invention, each stage ET1, ET2 includes four electrodes E1, E2, E3, E4, designed to receive transfer signals (not shown) with different phases, the transfer mode of the charges being in four phases.

Each pixel PX1, PX2, PX3 includes an elementary photosensitive zone Z1, Z2, Z3 and a potential well PI1, PI2, PI3 (FIG. 3A) designed to store charges produced during the integration period.

According to one characteristic of the invention, the surface of the storage potential well PI1, PI2, PI3 has a greater area than does the surface of the elementary photosensitive zones Z1, Z2, Z3, the result thereof being that, as compared with the prior art, there is an increase in the charge storage capacity at each pixel.

To this end, in the non-restrictive example of the description, each pixel includes two consecutive transfer stages to form a single potential well, while the surface of the elementary photosensitive zone of the same pixel has, in this example, an area limited to that of a single electrode, namely the electrode E2 of the stage ET1 in the non-restrictive example described.

It is clear that each pixel PX1 to PX3 could have more than two stages ET1, ET2 or it could have only one stage, the important point being that the surface area of the storage potential well PI1, PI2, PI3 of a pixel should be greater than the surface area of the elementary photosensitive zone Z1 to Z3 of the same pixel, these two surface areas being considered, of course, in substantially parallel planes. It must be noted that the result provided by the invention would be obtained also in the case of a pixel including a single transfer state ET1, ET2. Furthermore, with one or more transfer stages per pixel, the result of the invention can also be obtained with operation in two phases, three phases, five phases or more.

In the non-restrictive example described, where the electrodes E1 to E4 are all transparent to the useful radiation (represented by arrows RU) in such a way that their entire surface is photosensitive, a screen 20 that is opaque to the useful radiation is interposed between this radiation and all the electrodes, except for one electrode per pixel which represents the elementary photosensitive zone of the pixel, the electrode E2 in the non-restrictive example described. To this end, the screen has apertures 21 with dimensions that are far smaller than the dimensions of the potential wells PI1 to PI3, and with a surface area that determines the surface area of the photosensitive zones.

Here below, by way of a non-restrictive example, we have indicated orders of magnitude of the dimensions of elementary photosensitive zones Z1 to Z3 and storage potential wells PI1 to PI3: assuming, for example, that in the direction of the rows of pixels, i.e. in a direction perpendicular to the plane of the figure, these zones and these wells have one and the same dimension, in a direction parallel to the plane of the figure the elementary photosensitive zones Z1 to Z3 may have a dimension d1 of the order of 20 millimeters and the potential wells PI1 to PI3 may have a dimension d2 of the order of 150 micrometers.

In the case of operation in MPP mode, wherein all the electrodes E1 to E4 of all the stages, ET1, ET2, are taken to a negative potential with respect to the substrate 11 during the integration period TI, the potential wells PI1 to PI3 are formed between potential barriers BP1, BP2, BP3, BP4, formed by localized differences in the doping of the semiconductor material in the buried channel 12, namely by N- doped zones 14. These zones 14 are thus zones with the same type of conductivity as the buried channel 12 which has N type doping, but they are less doped than this channel 12.

According to one characteristic of the invention, the zones 14 are not obligatorily made at a rate of one per transfer stage ET1, ET2 as in the prior art because, with the invention, one and the same pixel may have several consecutive stages. Consequently, the zones 14, which form doses specific to the operation in MPP mode, are made only beneath the two electrodes that demarcate the pixel.

FIG. 3a illustrates profiles of potentials set up in the structure of FIG. 3 during the charge integration period TI. In accordance with the usual practice in charge-coupled devices, the positive potentials increase in the downward direction. FIGS. 3b and 3C illustrate profiles of potential set up in the structure of FIG. 3 during a charge transfer stage.

The storage potential wells PI1 to PI3 shown in FIG. 3A are those that exist beneath each pixel during the integration period TI, when the elementary photosensitive surfaces Z1 to Z3 are illuminated. In the image sensor according to the invention, the charges generated by the illumination of the elementary photosensitive zone Z1 to Z3 of each pixel PX1 to PX3 are stored in the potential well of this same pixel until the end of the integration period TI, the potential well in which the charges are stored having a greater dimension than the elementary photosensitive zone Z1 to Z3 which has produced these charges. After the integration period TI, a first, second and third quantity of charges Q1, Q2, Q3 are respectively stored in the first, second and third potential wells PI1, PI2, PI3, these charges being intended to be transferred in the transfer direction indicated by the arrow referenced ST.

It must be noted that, during the transfer of these quantities of charges Q1 to Q3, these charges are each divided into as many parts or packets as there are stages ET1, ET2 to form a pixel, independently of the number of phases applied to each stage. Thus, for example, in the case represented in FIG. 3, where each pixel PX1 to PX3 is formed by two stages ET1, ET2, each of the quantities of charges Q1, Q2, Q3 is divided into two parts A, B, as shown in FIG. 3B, and this is so as soon as the transfer signals ST1 to ST4 are applied to the electrodes E1 to E4.

FIG. 4 is a timing diagram that shows the phase relationship among the transfer signals ST1 to ST4 which are applied respectively to the electrodes E1 to E4 of FIG. 3. The lines a, b, c and d of FIG. 4 respectively show the transfer signals ST1, ST2, ST3, ST4.

An instant t0 corresponds to the start of the integration period TI. Throughout the duration of the integration period TI, the transfer signals ST1 to ST4 are all in the low stage or 0 state which, for example, in the case of an operation in MPP mode, corresponds to a negative voltage in the range of minus 10 Volts with respect to a reference voltage VR, the reference voltage VR being the voltage of the substrate 11. In the context of an operation in MPP mode, this enables the bias of the buried channel 12 shown in FIG. 3 to be reversed.

An instant t1 corresponds to the end of the integration period TI and to the start of a phase for the transfer of the quantities of charges Q1, Q2, Q3, to remove these charges to the exterior of the photosensitive zone. At the instant t1, the first and second transfer signals ST1, ST2 are in the state 0, while the third and fourth transfer signals ST3, ST4 have gone to the state 1 which, in the non-restrictive example described, corresponds substantially to a potential of 8 volts, positive with respect to the reference voltage VR.

At the instant t2, the first transfer signal ST1 goes to the state 1 which corresponds to a potential of the order of 8 volts with respect to the reference voltage VR; the second transfer signal ST2 is in the state 0, the third and fourth transfer signals ST3, ST4 are in the state 1.

At the instant t3: the first transfer signal ST1 is in the state 1, the second transfer signal ST2 is in the state 0; the third transfer signal ST3 goes from the state 1 to the state 0; the fourth transfer signal is in the state 1.

At the instant t4: the first transfer signal ST1 is in the state 1, the second transfer signal ST2 goes from the state 0 to the state 1; the third transfer signal ST3 is in the state 0; the fourth transfer signal is in the state 1.

At the instant t5: the first and second transfer signals ST1, ST2 are in the state 1, the third transfer signal ST3 is in the state 0; the fourth transfer signal ST4 goes from the state 1 to the state 0.

At the instant t6: the first and second transfer signals ST1, ST2 are in the state 1; the third transfer signal ST3 goes from the state 0 to the state 1; the fourth transfer signal ST4 is in the state 0.

At the instant t7: the first transfer signal ST1 goes from the state 1 to state 0; the second and third transfer signals ST2, ST3 are in the state 1; the fourth transfer signal ST4 is in the state 0.

At the instant t8: the first transfer signal ST1 is in the state 0; the second and third transfer signals ST2, ST3 are in the state 1; the fourth transfer signal ST4 goes to the state 1.

At the instant t9: the first transfer signal ST1 is in the state 0; the second transfer signal ST2 goes from the state 1 to the state 0; the third and fourth transfer signals ST3, ST4 are in the state 1.

At the instant t10: the first transfer signal goes from the state 0 to the state 1; the second transfer signal is in the state 0; the third transfer signal ST3 is in the state 1; the fourth transfer signal ST4 is in the state 1.

This shows a complete cycle of the first transfer signal for example, the cycle period TC of which is from the instant t2 to the instant t10; the four transfer signals being cyclical voltage peaks having a same cycle period.

Referring again to FIGS. 3, 3a, 3b, 3c, the application of the transfer signals ST1, ST2, ST3, ST4, respectively, to the electrodes E1, E2, E3, E4, modifies the potential wells that existed beneath these various electrodes during the integration period TI. Indeed, starting from the instant t1 when these transfer signals are applied to the electrodes, each pixel PX1, PX2 includes two potential wells PIA, PIB (shown in FIG. 3B) respectively containing a quantity of charges QA and QB, the sum of which forms the quantity of charges Q1 to Q3 which, up till the end of the integration period TI, was stored in a single storage potential well PI1, PI2, PI3 (shown in FIG. 3a); in the example of FIG. 3b, the potential wells PIA, PIB are formed, for each pixel, beneath the third and fourth electrodes of each stage ET1, ET2.

FIG. 3c illustrates the profiles of potentials that are obtained at the instant t3 shown in FIG. 4. As compared with the instant t1, the first transfer signal ST1 is in the state 1 while the third transfer signal ST3 has gone to the state 0. The result thereof is that the potential wells PIA, PIB have been shifted in the transfer direction ST and are located beneath the fourth and first electrodes of each stage ET1, ET2.

Each phase modification of the transfer signals ST1 to ST4 thus causes a shifting of the charges QA, QB in the transfer direction, in a manner that is standard per se.

Of course, the transfer of these charges into a reading register should enable the recovery of the entire quantity of charges Q1, Q2, Q3 which, having been initially stored in a pixel in one and the same potential well, might have then been separated into as many packets QA, QB as there were stages ET1, ET2 to constitute a pixel. For example, during the transfer from a reading register (not shown) of the charges QA, QB which were initially contained in the first pixel PX1 for example, the stage of the reading register that has first received the charge QA will keep the same position so that following transfer pulses transfer the charge QB into the same stage and make the sum QA+QB to obtain the initial charge Q1.

This necessity of adding up packets of charges, as a function of the number of stages included in a pixel, constitutes an additional element of complexity that is negligible in relation to the considerable increase obtained in the charge storage capacity. Moreover, as explained further above, the increase in the storage capacity may also be obtained with a single stage if the dimensions of the storage potential well are increased, that is, if the surface area of all the electrodes of the pixel is increased (naturally, within the limits of dimensions compatible with efficient transfer) as compared with the surface area of the elementary photosensitive zone of the pixel. FIG. 3.

What is claimed is:

1. A charge-coupled photosensitive device including a plurality of photosensitive cells or pixels, each pixel including an elementary photosensitive zone beneath which there is formed a storage potential well designed for the storage of charges generated by the exposure of the elementary photosensitive zone to a useful radiation during an integration period, the area of the surface of the storage potential well being greater than the area of the surface of the elementary photosensitive zone, each pixel including several electrodes, the electrodes succeeding one another in a direction of transfer of the charges so as to form a succession of transfer stages, wherein each pixel includes at least two transfer stages in which said storage potential well is formed.

2. A photosensitive device according to claim 1, wherein the storage potential wells are demarcated, along the transfer direction, by only two potential barriers independently of the number of transfer stages included in the pixel.

3. A photosensitive device according to claim 1, the transfer of charges being achieved by means of a buried channel, wherein each storage potential well is demarcated by two potential barriers obtained by (N-) doping difference in the buried channel.

4. A photosensitive device according to claim 3, wherein said device is of the buried channel type and wherein it works in a so-called MPP mode in which the bias of the buried channel is reversed during the exposure to the useful radiation.

5. A photosensitive device according to any of the preceding claims, comprising a screen that is opaque to the useful radiation, said screen being interposed between the useful radiation and at least one pixel, the screen including at least one aperture, the surface of which defines the surface of the elementary photosensitive zone of the pixel.

* * * * *